US005974577A

United States Patent [19]

Ma

[11] Patent Number: 5,974,577

[45] Date of Patent: Oct. 26, 1999

[54] INTEGRATED CIRCUIT WITH VOLTAGE OVER-STRESS INDICATING CIRCUIT

[75] Inventor: Manny K. Ma, Boise, Id.

[73] Assignee: Micron Technology, Inc., Boise, Id.

[21] Appl. No.: 08/949,419

[22] Filed: Oct. 14, 1997

Related U.S. Application Data

[63] Continuation of application No. 08/637,209, Apr. 24, 1996, abandoned.

[51] Int. Cl.[6] .................... G01R 31/28

[52] U.S. Cl. .................... 714/721; 365/201

[58] Field of Search .................... 371/21.4, 22.5; 361/56, 104, 115, 197; 327/404, 74, 78; 326/63, 35; 365/226, 201, 189.07; 714/180, 182.01, 182.03, 183.01, 183.06, 183.17, 185.01, 721, 723, 733

[56] References Cited

U.S. PATENT DOCUMENTS

| | | | |
|---|---|---|---|
| 4,716,302 | 12/1987 | Flannagan et al. | 307/200 |
| 5,132,565 | 7/1992 | Kuzumoto | 307/443 |
| 5,202,590 | 4/1993 | Liepold et al. | 307/362 |
| 5,367,491 | 11/1994 | Han et al. | 365/201 |
| 5,483,406 | 1/1996 | Bennett et al. | 361/56 |
| 5,497,117 | 3/1996 | Nakajima et al. | 327/404 |
| 5,532,618 | 7/1996 | Hardee et al. | 326/63 |
| 5,539,352 | 7/1996 | DuPuy | 327/514 |
| 5,570,043 | 10/1996 | Churchill | 326/81 |

*Primary Examiner*—Robert W. Beausoliel, Jr.
*Assistant Examiner*—Nadeem Iqbal
*Attorney, Agent, or Firm*—Seed and Berry LLP

[57] ABSTRACT

An integrated circuit package having external pins includes a function circuit, such as an address buffer, receiving an input voltage through one of the pins. If the input voltage exceeds a maximum rated voltage, the function circuit can be damaged by voltage over-stress. To provide a definitive indication that the function circuit may have been over-stressed, a diode and a fuse are connected in series between the function circuit's pin and ground. When the input voltage nears the maximum rated voltage, the diode biases and applies a voltage to the fuise. The fuse is selected so that when the input voltage exceeds the maximum rated voltage, the applied voltage blows the fuse. At a later time, the function circuit can be tested for over-stress by applying a voltage to the function circuit's pin which is sufficient to forward bias the diode. If no current flows after a sufficient biasing voltage is applied to the pin, it is a definitive indication that the function circuit may have been over-stressed.

41 Claims, 3 Drawing Sheets

INTEGRATED CIRCUIT WITH VOLTAGE OVER-STRESS INDICATING CIRCUIT

CROSS-REFERENCE TO RELATED APPLICATION

This application is a continuation of U.S. patent application Ser. No. 08/637,209, filed Apr. 24, 1996, now abandoned.

TECHNICAL FIELD

This invention relates in general to integrated circuits, and in particular to providing an indication that an integrated circuit may have been over-stressed by receiving a voltage well in excess of its normal operating voltages.

BACKGROUND OF THE INVENTION

A conventional integrated circuit (IC) device 10 shown in FIG. 1 typically houses a variety of "function" circuits (not shown), such as data buffers and power circuits, each receiving an input voltage from external circuitry (not shown) through one of multiple external pins 12. In general, the input voltage applied to each of the external pins 12 must be supplied within a limited range of voltages between maximum positive and negative rated voltages referred to as "over-stress" voltages. Otherwise, if the input voltage applied to one of the external pins 12 exceeds a maximum over-stress voltage, the function circuits (not shown) connected to the pin 12 may be damaged by voltage over-stress caused by excessive current flow or excessive voltage differentials within the function circuits (not shown). A positive over-stress voltage of 7.0 volts and a negative over-stress voltage of −1.0 volts are normal for a typical IC device 10 powered by a supply voltage of 5.0 volts.

When a customer returns a "defective" IC device to a manufacturer, the manufacturer may find it necessary or desirable to determine whether the "defect" in the returned device is a true defect or the result of the voltage over-stress described above. If the "defect" is a true defect caused by the manufacturing process, the manufacturer knows to adjust the process appropriately to reduce or eliminate the defect. However, if the "defect " is the result of voltage over-stress, the manufacturer knows there is no need to adjust the manufacturing process.

At the present time, manufacturers can only make educated guesses about the cause of a "defect" in an IC device, because no practical and definitive method exists to determine that an IC device has been damaged by voltage over-stress. If a manufacturer guesses wrong and incorrectly attributes a true defect to voltage over-stress, the manufacturer may fail to adjust the manufacturing process appropriately. As a result, the manufacturer may continue to manufacture defective IC devices without knowing it. While this would obviously be a problem in any industry, it is a particularly acute problem in the highly competitive IC device industry, where a slight difference in manufacturing yield between different manufacturers can be very significant. Therefore, there is a need in the art for an inventive device for definitively indicating that an IC device may have been subjected to an over-stressing input voltage.

SUMMARY OF THE INVENTION

An inventive over-stress indicating circuit provides a definitive indication that an IC device may have been over-stressed by an excessive voltage received at a voltage node of the IC device. The indicating circuit is coupled to the voltage node and it changes state from a first state to a second state when the magnitude of a voltage it senses at the voltage node exceeds the magnitude of a threshold voltage. In its second state, the indicating circuit indicates that the magnitude of the voltage at the voltage node has exceeded the magnitude of the threshold voltage during operation of the IC device. As a result, the inventive indicating circuit provides a definitive indication that the IC device may have been subjected to a potentially over-stressing voltage.

DETAILED DESCRIPTION OF THE INVENTION

Figure 1:
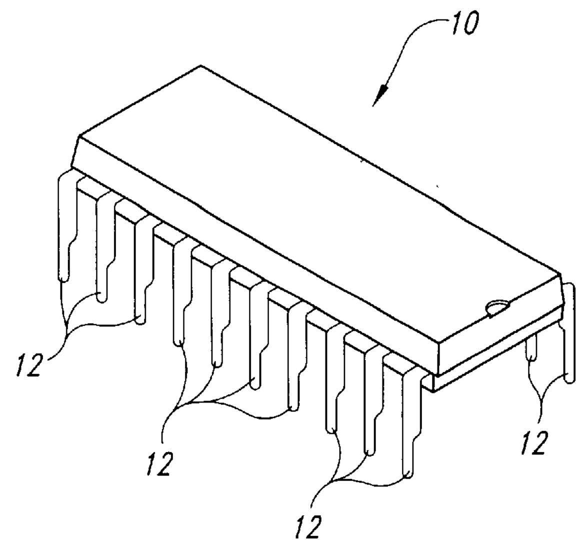
FIG. 1 is an isometric view of a typical prior art integrated circuit device.
Figure 2:
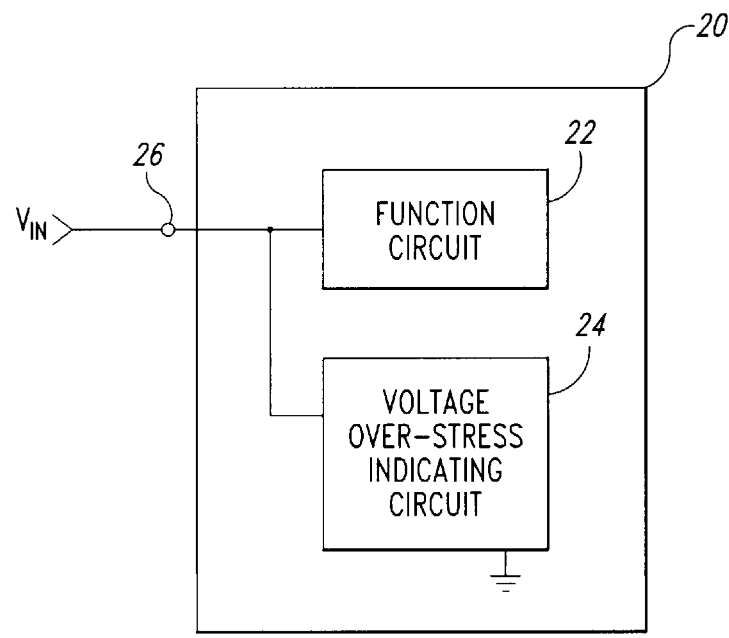
FIG. 2 is a block diagram of an integrated circuit device according to the present invention.

As shown in FIG. 2, an inventive IC device 20 includes a function circuit 22 and a voltage over-stress indicating circuit 24 both receiving an input voltage $V_{IN}$ through an input terminal 26. In operation, the function circuit 22 responds to the input voltage $V_{IN}$ by changing state as the input voltage $V_{IN}$ exceeds a first transition voltage $V_{TR1}$, such as 0.7 volts, or falls below a second transition voltage $V_{TR2}$ which may be the same as the first transition voltage $V_{TR1}$. The transition voltage $V_{TR1}$ may, for example, be the threshold voltage of a MOSFET transistor in the function circuit 22. If the magnitude of the input voltage $V_{IN}$ exceeds a positive over-stress voltage, such as 7.0 volts, or exceeds the magnitude of a negative over-stress voltage, such as −1.0 volts, the function circuit 22 may be damaged by voltage over-stress. The function circuit 22 may be any circuit which is susceptible to damage by voltage over-stress, including, for example, address buffers, data buffers and decoder circuits. Also, although the present invention will be described with respect to one flnction circuit connected to one input terminal, it will be understood that the present invention will also work with multiple flnction circuits connected to the same or multiple input terminals.

A wide variety of configurations are suitable for the IC device 20. In some configurations, the function circuit 22 and the voltage over-stress indicating circuit 24 are provided on the same die. In other configurations, the function circuit 22 and the indicating circuit 24 are provided on separate dies and possibly in separate packages. Some suitable configurations include a dual inline package (DIP), a leadless ceramic chip carrier (LCCC), a plastic quad flat package (PQFP), a pin grid array (PGA), a pad array carrier (PAC), a ball grid array (BGA), a single in-line package (SIP), a single in-line memory module (SIMM), a lead-on-substrate (LOS) multi-chip package, and a multi-chip module (MCM). Another configuration for the IC device 20 is to directly attach the die or dies containing the function circuit 22 and the indicating circuit 24 to an interconnect board using direct chip attachment (DCA) methods such as die and wire bonding, tape-automated bonding or flip-chip bonding. Also, it should be understood that the input terminal 26 may be any appropriate terminal, such as a pin, a pad, a tab or a ball.

The voltage over-stress indicating circuit 24 remains in a no-stress state when it receives the input voltage $V_{IN}$ at less than the positive over-stress voltage. In its no-stress state, the indicating circuit 24 indicates that the input voltage $V_{IN}$ has not over-stressed the function circuit 22. Preferably, the indicating circuit 24 provides this indication with a fuse or anti-fuse, as described below in reference to FIGS. 4A–C. However, any component suitable for providing the indication may be used, including an optical, electronic or radio frequency interconnect, or a visually perceptible change.

If the input voltage $V_{IN}$ exceeds the positive over-stress voltage, the indicating circuit 24 changes state from its no-stress state to an over-stress state. Once the indicating circuit 24 enters its over-stress state, it remains there, even if the input voltage $V_{IN}$ subsequently falls below the positive over-stress voltage. In its over-stress state, the indicating circuit 24 indicates that the input voltage $V_{IN}$ has exceeded the positive over-stress voltage, thereby possibly over-stressing the function circuit 22. Again, preferably the indicating circuit 24 provides this indication with a fuse or anti-fuse, as described below in reference to FIGS. 4A–C, but any component suitable for providing the indication may be used. Also, in an alternative version described below in reference to FIG. 4C, the indicating circuit 24 also enters its over-stress state if the input voltage $V_{IN}$ falls below a negative over-stress voltage and thus possibly over-stresses the function circuit 22.

Figure 3:
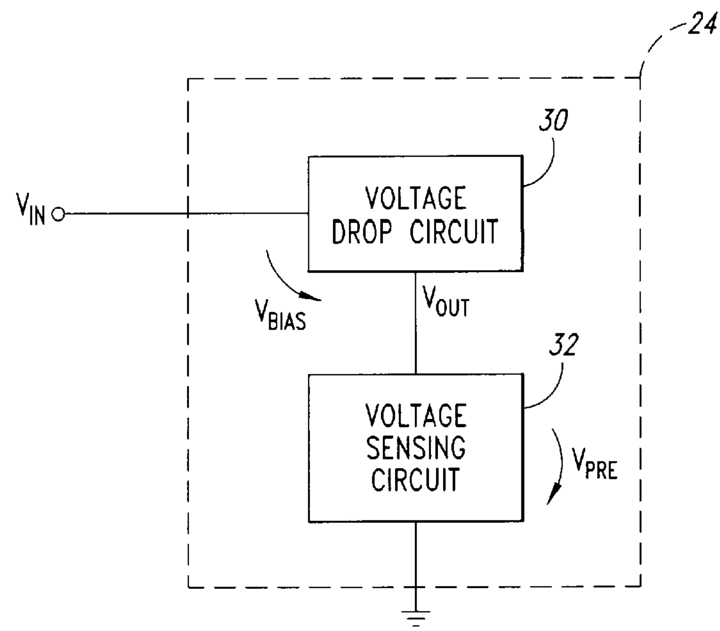
FIG. 3 is a block diagram of a voltage drop circuit and a voltage sensing circuit used in the integrated circuit device of FIG. 2.

The voltage over-stress indicating circuit 24 is shown in more detail in FIG. 3. The indicating circuit 24 includes a voltage drop circuit 30 receiving the input voltage $V_{IN}$. The voltage drop circuit 30 isolates the input terminal 26 (FIG. 2) from a voltage sensing circuit 32 when the input voltage $V_{IN}$ is less than a bias voltage $V_{BIAS}$. When the input voltage $V_{IN}$ exceeds the bias voltage $V_{BIAS}$, the voltage drop circuit 30 outputs an output voltage $V_{OUT}$ equal to the input voltage $V_{IN}$ less the bias voltage $V_{BIAS}$. A predetermined voltage $V_{PRE}$ of the voltage sensing circuit 32 is selected so the sum of the bias voltage $V_{BIAS}$ and the predetermined voltage $V_{PRE}$ equals the positive over-stress voltage. Thus, when the input voltage $V_{IN}$ exceeds the positive over-stress voltage, the output voltage $V_{OUT}$ exceeds the predetermined voltage $V_{PRE}$. As a result, the voltage sensing circuit 32 changes state from a no-stress state to an over-stress state. If the input voltage $V_{IN}$ subsequently drops below the positive over-stress voltage and causes the output voltage $V_{OUT}$ to drop below the predetermined voltage $V_{PRE}$, the voltage sensing circuit 32 remains in its over-stress state. In its over-stress state, the voltage sensing circuit 32 indicates that the input voltage $V_{IN}$ has exceeded the positive over-stress voltage, thereby possibly over-stressing the function circuit 22 (FIG. 2). Preferably, the voltage sensing circuit 32 makes this indication with a fuse or anti-fuse, as described below in reference to FIGS. 4A–C, but any component suitable for providing the indication may be used.

Also, in the alternative version described below in reference to FIG. 4C, the voltage sensing circuit 32 also enters its over-stress state if the input voltage $V_{IN}$ falls below the negative over-stress voltage and thus possibly over-stresses the function circuit 22. In this alternative version, once the voltage sensing circuit 32 enters its over-stress state, it remains there, even if the input voltage $V_{IN}$ subsequently rises above the negative over-stress voltage.

Figure 4:
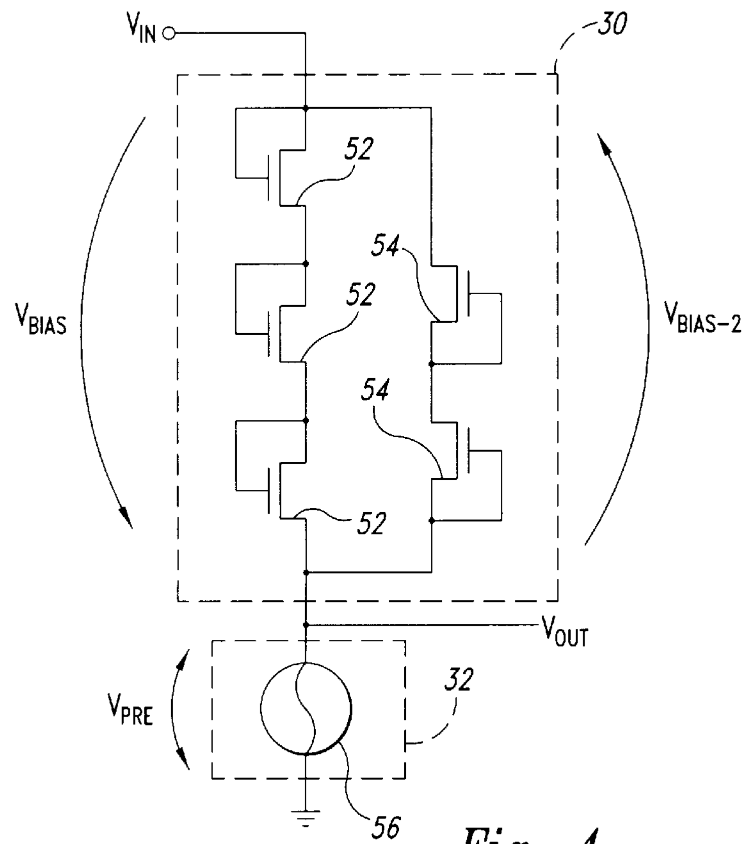
FIGS. 4A, 4B and 4C are schematics of alternative versions of the voltage drop circuit and voltage sensing circuit of FIG. 3.

The voltage drop circuit 30 and voltage sensing circuit 32 are shown in more detail in FIGS. 4A–C. As shown in FIG. 4A, the voltage drop circuit 30 comprises multiple diodes 40 coupled in series. The diodes 40 are selected so they will all be forward biased when the input voltage $V_{IN}$ exceeds the bias voltage $V_{BIAS}$. Any suitable diodes will work for purposes of this invention, including diode-connected transistors. Also, the voltage sensing circuit 32 may be a fuse 42 selected to "blow" when the output voltage $V_{OUT}$ from the diodes 40 exceeds the predetermined voltage $V_{PRE}$ as a result of the input voltage $V_{IN}$ exceeding the positive over-stress voltage. When the fuse 42 blows, it readily indicates that the input voltage $V_{IN}$ has exceeded the positive over-stress voltage, because the fuse 42 will fail to conduct current even when an input voltage $V_{IN}$ sufficient to bias the diodes 40 is applied to the input terminal 26 (FIG. 2). Any suitable fuse or fuse circuit can be used, including metal fuses, polycarbonate fuses, anti-fuses, nitride fuses and dielectride fuses. Also, it should be noted that the order of the series-connected diodes 40 and fuse 42 can be reversed, and that the fuse 42 can be placed in series between some of the diodes 40.

As shown in an alternative version in FIG. 4B, the voltage drop circuit 30 comprises diode-connected NMOS transistors 44, 46 and 48. The threshold voltages of the NMOS transistors 44 and 46 are selected so the NMOS transistors 44 and 46 will conduct when the input voltage $V_{IN}$ exceeds the bias voltage $V_{BIAS}$. Also, the threshold voltages of the NMOS transistors 46 and 48 are selected so the NMOS transistors 46 and 48 will conduct when a second input voltage $V_{IN\_2}$ from a second input terminal (not shown) exceeds a second bias voltage $V_{BIAS\_2}$. As described below, by accommodating multiple input voltages, the alternative voltage drop circuit 30 of FIG. 4B allows the alternative voltage sensing circuit 32 of FIG. 4B to indicate that the input voltage $V_{IN}$ has exceeded the positive over-stress voltage for the function circuit 22 (FIG. 2), or that the second input voltage $V_{IN\_2}$ has exceeded the positive over-stress voltage for a different function circuit (not shown). Of course, additional diode-connected NMOS transistors (not shown) can be added to the voltage drop circuit 30 so it will accommodate more than two input voltages. The embodiment shown in FIG. 4B also allows a single voltage sensing circuit 32 to indicate whether an over-stressing input voltage has been applied to one of several input terminals.

The voltage sensing circuit 32 of FIG. 4B comprises an anti-fuse 50 selected to "burn through" when the output voltage $V_{OUT}$ from the NMOS transistor 46 exceeds the predetermined voltage $V_{PRE}$ as a result of the input voltage $V_{IN}$,or the second input voltage $V_{IN\_2}$, exceeding the positive over-stress voltage. When the anti-fuse 50 burns through, it readily indicates that the input voltage $V_{IN}$ has exceeded the positive over-stress voltage for the function circuit 22 (FIG. 2), or that the second input voltage $V_{IN\_2}$ has exceeded the positive over-stress voltage for its function circuit (not shown), because the anti-fuse 50 will conduct current when an input voltage $V_{IN}$ sufficient to cause the NMOS transistors 44 and 46 to conduct is applied to the input terminal 26 (FIG. 2), or when a second input voltage $V_{IN\_2}$ sufficient to cause the NMOS transistors 46 and 48 to conduct is applied.

As shown in another alternative version in FIG. 4C, the voltage drop circuit 30 comprises multiple diode-connected NMOS transistors 52 coupled in parallel with multiple diode-connected NMOS transistors 54. The threshold voltages of the NMOS transistors 52 are selected so they will conduct when the input voltage $V_{IN}$ becomes more positive than the bias voltage $V_{BIAS}$, and the threshold voltages of the NMOS transistors 54 are selected so they will conduct when the input voltage $V_{IN}$ becomes more negative than a second bias voltage $V_{BIAS\_2}$. The threshold voltages of the NMOS transistors 54 are also selected so the sum of the second bias voltage $V_{BIAS\_2}$ and the magnitude of the predetermined voltage $V_{PRE}$ is equal to the negative over-stress voltage. As a result, when the input voltage $V_{IN}$ drops below ground, it causes the NMOS transistors 54 to conduct before it possibly over-stresses the function circuit 22 (FIG. 2) as a result of dropping to less than the negative over-stress voltage.

The voltage sensing circuit 32 of FIG. 4C comprises a fuse 56 selected to "blow" when the output voltage $V_{OUT}$ from the NMOS transistors 52 exceeds the predetermined voltage $V_{PRE}$ as a result of the input voltage $V_{IN}$ exceeding the positive over-stress voltage. The fuse 56 is also selected to blow when the output voltage $V_{OUT}$ from the NMOS transistors 54 becomes more negative than $-V_{PRE}$ as a result of the input voltage becoming more negative than the negative over-stress voltage. When the fuse 56 blows, it readily indicates that the input voltage $V_{IN}$ has exceeded the positive or negative over-stress voltages, because the fuse 56 will fail to conduct current even when an input voltage $V_{IN}$ sufficient to cause the NMOS transistors 52 or the NMOS transistors 54 to conduct is applied. Thus, by providing additional NMOS transistors 54 which conduct when the input voltage $V_{IN}$ becomes sufficiently negative, the alternative voltage drop circuit 30 of FIG. 4C allows the voltage sensing circuit 32 of FIG. 4C to indicate when the input voltage $V_{IN}$ has fallen to less than the negative over-stress voltage and has thereby possibly over-stressed the flnction circuit 22 (FIG. 2). Of course, a wide variety of circuits other than the NMOS transistors 52 and 54 will work as the voltage drop circuit 30 for this purpose, including avalanche and zener diodes.

Figure 5:
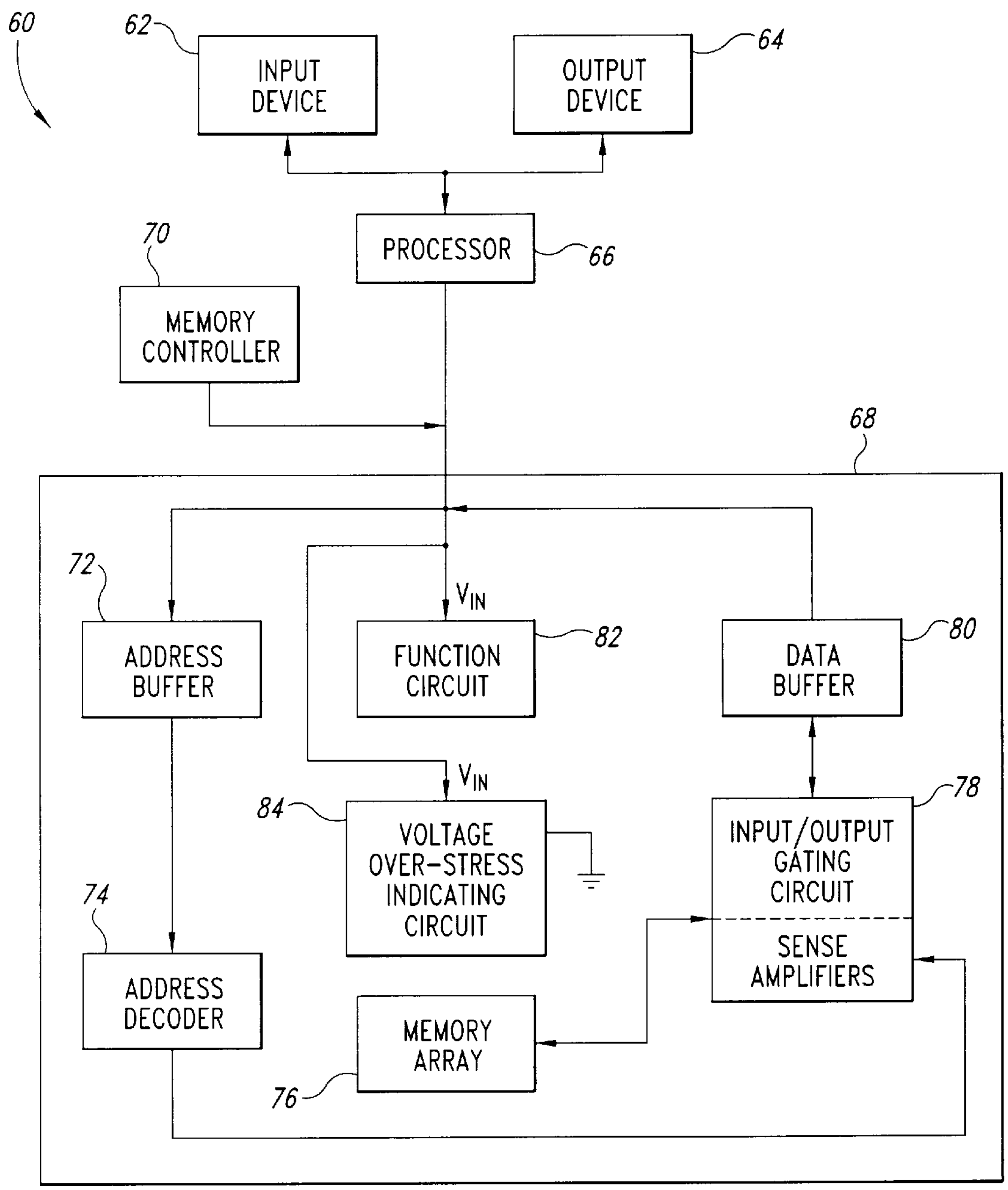
FIG. 5 is block diagram of a computer system having a memory device including the integrated circuit device of FIG. 2.

The inventive IC device may be incorporated into a computer system 60 as shown in FIG. 5. The computer system 60 includes an input device 62, such as a keyboard, an output device 64, such as a display, and a processor 66 coupled to the input device 62 and the output device 64. The computer system 60 also includes a memory device 68 coupled to the processor 66 to receive address, data and control signals, and a memory controller 70 coupled to the memory device 68.

The memory device 68 includes an address buffer 72 receiving address signals, an address decoder 74 coupled to the address buffer 72, a memory array 76 coupled to the address decoder 74, an input/output gating circuit and sense amplifiers 78 coupled to the address decoder 74 and the memory array 76, and a data buffer 80 coupled to the input/output gating circuit and sense amplifiers 78 and receiving data voltages. The memory device 68 also includes a function circuit 82 as described above with respect to FIG. 2, and a voltage over-stress indicating circuit 84 as described above with respect to FIGS. 2, 3 and 4A–C.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. An apparatus for indicating voltage stress to an integrated circuit having a voltage node, the apparatus comprising a voltage sensing circuit coupled to said node, said voltage sensing circuit being operable to compare a voltage at said node to a threshold value, said sensing circuit comprising a non-volatile indicating circuit having first and second states, said indicating circuit changing from said first state to said second state in response to a voltage sensed at said voltage node in excess of said threshold value, wherein the operation of said integrated circuit being substantially independent of said state of said indicating circuit.

2. The apparatus of claim 1 wherein the indicating circuit comprises a voltage drop circuit and a voltage sensing circuit coupled in series between the voltage node and a reference node, the voltage drop circuit isolating the voltage node from the reference node until a voltage applied to the voltage drop circuit exceeds a bias voltage, the voltage sensing circuit changing state from the first state to the second state when a voltage applied to the voltage sensing circuit exceeds a predetermined voltage and remaining in the second state when the applied voltage subsequently falls to less than the predetermined voltage, the sum of the bias voltage and the predetermined voltage being substantially equal to the magnitude of the threshold value, the voltage sensing circuit thereby indicating in the second state that the integrated circuit may have been subjected to voltage over-stress.

3. The apparatus of claim 1 wherein the apparatus and the integrated circuit are provided in the same integrated circuit package.

4. The apparatus of claim 3 wherein the apparatus and the integrated circuit are provided on the same die.

5. An apparatus for providing an indication of voltages applied to an integrated circuit outside a predetermined range, said integrated circuit having a voltage node and having operating circuitry electrically coupled to said voltage node, said apparatus comprising voltage sensing circuitry electrically coupled to said voltage node, said sensing circuitry comprising a non-volatile indicating circuit electrically disposed generally in parallel to said operating circuitry in a manner that allows said operating circuitry to continue to operate, independent of the state of said indicating circuit, said indicating circuitry laving first and second states and changing from said first state to said second state in response to a sensed voltage outside of said predetermined range.

6. The apparatus of claim 5 wherein the apparatus and the integrated circuit are provided in the same integrated circuit package.

7. The apparatus of claim 5 wherein the indicating circuitry changes from the first state to the second state in response to a sensed voltage more positive than the predetermined range.

8. The apparatus of claim 5 wherein the indicating circuitry changes from the first state to the second state in response to a sensed voltage more negative than the predetermined range.

9. An integrated circuit device comprising:

a function circuit receiving an input voltage through an externally accessible input terminal, the function circuit changing state form a first state to a second state when the input voltage exceeds a first transition voltage and from the second state to the first state when the input voltage falls to less than a second transition voltage that may be the same as the first transition voltage, the first state being different than the second state, the function circuit being susceptible to voltage over-stress when the absolute value of the input voltage exceeds the absolute value of an over-stress voltage; and a voltage over-stress indicating circuit coupled to the input terminal, the voltage over-stress indicating circuit changing state from a no-stress state to an over-stress state when the absolute value of the input voltage exceeds the absolute value of the over-stress voltage and remaining in the over-stress state when the absolute value of the input voltage subsequently falls to less than the absolute value of the over-stress voltage, the voltage over-stress indicating circuit indicating in its no-stress state that the absolute value of the input voltage has remained less than the absolute value of the over-stress voltage and indicating in its over-stress state that the absolute value of the input voltage has exceeded the absolute value of the over-stress voltage and thereby that the input voltage may have over-stressed the function circuit, the voltage over-stress indicating circuit being coupled to the function circuit in a manner that allows operation of said function circuit independent of the state of said voltage over-stress indicating circuit.

10. The integrated circuit device of claim 9 wherein the over-stress voltage is greater than the first and second transition voltages.

11. The integrated circuit device of claim 9 wherein the over-stress voltage is less than the first and second transition voltages.

12. The integrated circuit device of claim 9 wherein the voltage over-stress indicating circuit comprises a voltage drop circuit and a voltage sensing circuit coupled in series between the input terminal and a reference node, the voltage drop circuit isolating the input terminal from the reference node until a voltage applied to the voltage drop circuit exceeds a bias voltage, the voltage sensing circuit changing state from the no-stress state to the over-stress state when a voltage applied to the voltage sensing circuit exceeds a predetermined voltage and remaining in the over-stress state when the applied voltage subsequently falls to less than the predetermined voltage, the sum of the bias voltage and the predetermined voltage being substantially equal to the magnitude of the over-stress voltage, the voltage sensing circuit thereby indicating in the no-stress state that the absolute value of the input voltage has remained less than the absolute value of the over-stress voltage and indicating in the over-stress state that the absolute value of the input voltage has exceeded the absolute value of the over-stress voltage.

13. The integrated circuit device of claim 12 wherein the voltage drop circuit comprises at least one diode.

14. The integrated circuit device of claim 12 wherein the voltage drop circuit comprises at least one diode-connected transistor.

15. The integrated circuit device of claim 14 wherein the transistors are MOSFET's.

16. The integrated circuit device of claim 12 wherein the voltage sensing circuit comprises at least one fuse so the voltage over-stress indicating circuit indicates in its over-stress state that the input voltage may have over-stressed the function circuit by failing to conduct current after the absolute value of the input voltage has exceeded the absolute value of the over-stress voltage.

17. The integrated circuit device of claim 16 wherein the fuses are polycarbonate fuses.

18. The integrated circuit device of claim 16 wherein the fuses are metal fuses.

19. The integrated circuit device of claim 12 wherein the voltage sensing circuit comprises at least one anti-fuse so the voltage over-stress indicating circuit indicates in its over-stress state that the input voltage may have over-stressed the function circuit by conducting current after the absolute value of the input voltage has exceeded the absolute value of the over-stress voltage.

20. The integrated circuit device of claim 9 wherein the voltage over-stress indicating circuit comprises at least one diode circuit coupled in series with at least one fuse circuit, the diode circuits being constructed to be biased and the fuse circuits being constructed to permanently change state when the absolute value of the input voltage exceeds the absolute value of the over-stress voltage.

21. The integrated circuit device of claim 20 wherein each fuse circuit comprises an anti-fuse so the voltage over-stress indicating circuit indicates in its over-stress state that the input voltage may have over-stressed the function circuit by conducting current after the absolute value of the input voltage has exceeded the absolute value of the over-stress voltage.

22. The integrated circuit device of claim 20 wherein each diode circuit comprises a diode-connected transistor.

23. The integrated circuit device of claim 9 wherein the function circuit and the voltage over-stress indicating circuit are provided on different dies.

24. The integrated circuit device of claim 23 wherein the integrated circuit device is a multi-chip module.

25. The integrated circuit device of claim 23 wherein the integrated circuit device is a SIMM package.

26. The integrated circuit of claim 9 wherein the voltage over-stress indicating circuit changes state from a no-stress state to an over-stress state when either the input voltage becomes more positive than a positive over-stress voltage or the input voltage becomes more negative than a negative over-stress voltage.

27. An integrated circuit device housed in a package having a plurality of input terminals accessible to external circuitry, the integrated circuit device comprising:

a plurality of function circuits each coupled to one of the input terminals to receive an input voltage through the input terminal, each function circuit changing state from a first state to a second state when its input voltage exceeds a first transition voltage and from the second state to the first state when its input voltage falls to less than a second transition voltage, the first state of each function circuit being different than the second state, each function circuit being susceptible to voltage over-stress when the magnitude of its input voltage exceeds the magnitude of an over-stress voltage; and a voltage over-stress indicating circuit coupled to the input terminal of each function circuit, the voltage over-stress indicating circuit changing state from a no-stress state to an over-stress state when the magnitude of the input voltage of one of the function circuits exceeds the magnitude of the over-stress voltage of the function circuit and remaining in the over-stress state when the magnitude of the input voltage of the function circuit subsequently falls to less than the magnitude of the over-stress voltage of the function circuit, the voltage over-stress indicating circuit indicating in its no-stress state that the magnitude of the input voltages of the function circuits have remained less than their associated over-stress voltage magnitudes and indicating in its over-stress state that the magnitude of the input voltage of at least one of the function circuits has exceeded the magnitude of the over-stress voltage of the fiction circuit and thereby that the input voltage may have over-stressed the function circuit, the voltage over-stress indicating circuit being coupled to the function circuit in a manner that allows operation of said function circuit independent of the state of said voltage over-stress indicating circuit.

28. The integrated circuit device of claim 27 wherein the voltage over-stress indicating circuit has a reference node, wherein the voltage over-stress indicating circuit comprises at least one diode circuit and at least one fuse circuit coupled in series with one another between each input terminal and the reference node, the series-connected diode circuits and fuse circuits associated with each input terminal being constructed such that the diode circuits are biased and their associated fuse circuits permanently change state when the magnitude of their associated input voltage exceeds the magnitude of the corresponding over-stress voltage, the voltage over-stress indicating circuit thereby entering the over-stress state.

29. The integrated circuit device of claim 28 wherein one of the diode circuits coupled between one of the input terminals and the reference node is also coupled between another one of the input terminals and the reference node so both input terminals share the diode circuit.

30. The integrated circuit device of claim 28 wherein one of the fuse circuits coupled between one of the input terminals and the reference node is also coupled between another one of the input terminals and the reference node so both input terminals share the fuse circuit.

31. A computer system comprising:

an input device;

an output device;

a processor coupled to the input and output devices;

a memory controller; and a memory device housed in a package having a plurality of terminals coupled to the processor and the memory controller, the memory device comprising:

an address buffer coupled to the processor through the terminals;

an address decoder coupled to the address buffer;

a memory array coupled to the address decoder;

a plurality of sense anplifiers coupled to the memory array and the address decoder;

an input/output gating circuit coupled to the memory array, the sense amplifiers and the address decoder;

a data input/output buffer coupled to the processor through the terminals and to the input/output gating circuit;

a function circuit receiving an input voltage through one of the terminals, the function circuit changing state from a first state to a second state when the input voltage exceeds a first transition voltage and from the second state to the first state when the input voltage falls to less than a second transition voltage, the first state being different than the second state, the function circuit being susceptible to voltage over-stress when the magnitude of the input voltage exceeds the magnitude of an over-stress voltage; and a voltage over-stress indicating circuit coupled to the function circuit's terminal, the voltage over-stress indicating circuit changing state from a no-stress state to an over-stress state when the magnitude of the input voltage exceeds the magnitude of the over-stress voltage and remaining in the over-stress state when the magnitude of the input voltage subsequently falls to less than the magnitude of the over-stress voltage, the voltage over-stress indicating circuit indicating in its no-stress state that the magnitude of the input voltage has remained less than the magnitude of the over-stress voltage and indicating in its over-stress state that the magnitude of the input voltage has exceeded the magnitude of the over-stress voltage and thereby that the input voltage may have over-stressed the function circuit, the voltage over-stress indicating circuit being coupled to the function circuit in a manner that allows operation of said function circuit independent of the state of said voltage over-stress indicating circuit.

32. A computer system comprising:

an input device;

an output device; and a plurality of integrated circuits, at least one of the integrated circuits including a processor coupled to the input and output devices, at least one of the integrated circuits including a memory device coupled to the processor, at least one of said integrated circuits having a voltage node and being subject to voltage over-stress from excessive voltages applied to said integrated circuit through said voltage node, said integrated circuit including a voltage sensing circuit coupled to said voltage node, said voltage sensing circuit being operable to compare a voltage at said node to a threshold value, said sensing circuit comprising a non-volatile indicating circuit having first and second states, said indicating circuit changing from said first state to said second state in response to a voltage sensed at said voltage node in excess of said threshold value, the operation of said integrated circuit being substantially independent of the state of said indicating circuit.

33. The computer system of claim 32 wherein the integrated circuit having the voltage node and being subject to voltage over-stress and the indicating circuit are provided on the same die.

34. A computer system comprising:

an input device;

an output device; and a plurality of integrated circuits, at least one of the integrated circuits including a processor coupled to the input and output devices, at least one of the integrated circuits including a memory device coupled to the processor, at least one of said integrated circuits having a voltage node and having operating circuitry electrically coupled to said voltage node and being subject to voltage over-stress from voltages applied to said operating circuitry through said voltage node outside of a predetermined range, at least one of said integrated circuits including a voltage sensing circuit electrically coupled to said voltage node, said sensing circuitry comprising a non-volatile indicating circuit electrically disposed generally in parallel to said operating circuitry and allowing operation of said operating circuitry independent of the state of said indicating circuitry, said indicating circuit having first and second states and changing from said first state to said second state in response to a voltage sensed at the voltage node outside of said predetermined range.

35. The computer system of claim 34 wherein the apparatus and the integrated circuit are provided in the same integrated circuit package.

36. The computer system of claim 34 wherein the indicating circuitry changes from the first state to the second state in response to a sensed voltage more positive than the predetermined range.

37. The computer system of claim 34 wherein the indicating circuitry changes from the first state to the second state in response to a sensed voltage more negative than the predetermined range.

38. A method for detecting that a function circuit in an integrated circuit device may have been over-stressed by receiving an input voltage having a magnitude greater than the magnitude of an over-stress voltage of the function circuit, the method comprising:

entering an over-stress state of the integrated circuit device when the magnitude of the input voltage exceeds the magnitude of the over-stress voltage, the over-stress state being detectable;

remaining in the over-stress state when the magnitude of the input voltage subsequently falls to less than the magnitude of the over-stress voltage; and detecting that the integrated circuit device is in the over-stress state and thereby detecting that the function circuit has been subjected to the magnitude of the input voltage being greater than the magnitude of the over-stress voltage, the integrated circuit device continuing to operate during the entering, remaining and detecting steps and after the magnitude of the input voltage exceeds the magnitude of the over-stress voltage.

39. The method of claim 38 wherein the step of entering the over-stress state includes permanently changing the state of a fuse circuit, wherein the step of detecting that the integrated circuit device is in the over-stress state includes determining the amount of current flow through the fuse circuit.

40. A method of detecting that an integrated circuit may have been subjected to voltage over-stress as a result of receiving an input voltage at a voltage node having a magnitude greater than the magnitude of a threshold value, the method comprising:

relating the input voltage to the threshold value;

changing an indicator generally associated with the integrated circuit in a manner which is detectable if the input voltage exceeds the magnitude of the threshold voltage even if the input voltage subsequently decreases to less than the magnitude of the threshold voltage; and detecting any change in the indicator and thereby detecting that the integrated circuit may have been subjected to voltage over-stress, the integrated circuit continuing to operate during the relating, changing and detecting steps and after the input voltage exceeds the magnitude of the threshold voltage.

41. The method of claim 40 wherein the step of changing the indicator comprises changing an indicator comprising an over-stress indicating circuit from a first state to a second state, the second state being detectable.

* * * * *

UNITED STATES PATENT AND TRADEMARK OFFICE

CERTIFICATE OF CORRECTION

PATENT NO. : 5,974,577
DATED : October 26, 1999
INVENTOR(S) : Ma

It is certified that error appears in the above-identified patent and that said Letters Patent is hereby corrected as shown below:

| | | |
|---|---|---|
| Column 2, line 48 | "flnction" | - - function - - |
| Column 2, line 50 | "flnction" | - - function - - |
| Column 6, line 36 | "laving" | - - having - - |
| Column 6, line 54 | "form" | - - from - - |
| Column 8, line 59 | "fiction" | - - function - - |
| Column 9, line 34 | "anplifiers" | - - amplifiers - - |

Signed and Sealed this

Twenty-second Day of May, 2001

Attest:

NICHOLAS P. GODICI

*Attesting Officer*

*Acting Director of the United States Patent and Trademark Office*